US009852989B1

(12) United States Patent
Lin et al.

(10) Patent No.: US 9,852,989 B1
(45) Date of Patent: Dec. 26, 2017

(54) POWER GRID OF INTEGRATED CIRCUIT

(71) Applicant: Taiwan Semiconductor Manufacturing Co., Ltd., Hsinchu (TW)

(72) Inventors: Chin-Shen Lin, Taipei (TW); Min-Yuan Tsai, Hsinchu (TW); Kuo-Nan Yang, Hsinchu (TW); Chung-Hsing Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/397,036

(22) Filed: Jan. 3, 2017

Related U.S. Application Data

(60) Provisional application No. 62/426,946, filed on Nov. 28, 2016.

(51) Int. Cl.
*H01L 23/52* (2006.01)
*H01L 23/528* (2006.01)
*H01L 23/522* (2006.01)

(52) U.S. Cl.
CPC ...... *H01L 23/5286* (2013.01); *H01L 23/5226* (2013.01)

(58) Field of Classification Search
CPC ........................ H01L 23/5286; H01L 23/5226
USPC .................................................. 257/691, 774
See application file for complete search history.

(56) References Cited

U.S. PATENT DOCUMENTS 5,288,949 A * 2/1994 Crafts .................. H01L 23/538 174/117 FF
8,421,205 B2 4/2013 Yang
8,661,389 B2 2/2014 Chern et al.
8,686,567 B2 * 4/2014 Endo .................. H01L 23/5286 257/691
8,698,205 B2 4/2014 Tzeng et al.
8,826,212 B2 9/2014 Yeh et al.
8,836,141 B2 9/2014 Chi et al.
8,875,076 B2 10/2014 Lin et al.
9,147,029 B2 9/2015 Ke et al.
9,336,348 B2 5/2016 Hsieh et al.
9,401,258 B2 7/2016 Hung et al.
9,412,700 B2 8/2016 Hsieh et al.
9,431,381 B2 8/2016 Hsieh et al.
9,477,803 B2 10/2016 Wang et al.
2014/0175662 A1 6/2014 Yang
(Continued)

*Primary Examiner* — Thien F Tran
(74) *Attorney, Agent, or Firm* — McClure, Qualey & Rodack, LLP

(57) ABSTRACT

Power grids of an IC are provided. A power grid includes first power traces disposed in a first metal layer and parallel to a first direction, second power traces disposed in a second metal layer and parallel to a second direction that is perpendicular to the first direction, and third power traces disposed in the first metal layer parallel to the first direction. The first power traces arranged in the same straight line are separated from each other by a plurality of first gaps. The third power traces arranged in the same straight line are separated from each other by a plurality of second gaps. Each first gap is surrounded by the two adjacent third power traces. Each second gap is surrounded by the two adjacent first power traces. The first power traces are coupled to the third power traces via the second power traces.

20 Claims, 5 Drawing Sheets

430 415 415
430a 430b 415a 415b 415c 415a 415b 415c 400
430c 430d 410a 410a
410a 420a 410b 410 410b 410b 420a 420b 420b 420 410c 410c 420c 420c 410c 460a 460b
10 20 G0 G1 G2 G3 G4

(56) References Cited

U.S. PATENT DOCUMENTS

2014/0264924 A1 9/2014 Yu et al.
2014/0282289 A1 9/2014 Hsu et al.
2015/0279453 A1 10/2015 Fujiwara et al.
2015/0318241 A1 11/2015 Chang et al.
2015/0347659 A1 12/2015 Chiang et al.
2015/0357279 A1 12/2015 Fujiwara et al.
2015/0370946 A1 12/2015 Yang et al.
2016/0012169 A1 1/2016 Chiang et al.
2016/0013271 A1 1/2016 Chiang et al.
2016/0079162 A1 3/2016 Hsieh et al.
2016/0126232 A1 5/2016 Liu et al.
2016/0147927 A1 5/2016 Chiang et al.
2016/0276331 A1 9/2016 Liaw

* cited by examiner

POWER GRID OF INTEGRATED CIRCUIT

CROSS REFERENCE TO RELATED APPLICATIONS

This Application claims priority of U.S. Provisional Application No. 62/426,946, filed on Nov. 28, 2016, the entirety of which is incorporated by reference herein.

BACKGROUND

In integrated circuit (IC) design, a power grid is used to deliver power and ground to the transistors as efficiently as possible. The power grid is a power distribution network. In general, the power distribution network should have a minimal voltage variation and a high current carrying capability. For example, if the voltage variation caused by the power grid is increased, signal strength of the delivered power is decreased, and IR drop is present. Thus, the components (e.g. standard cells or transistors) of the IC cannot work normally, experiencing such problems as function failure, or a reduction of operating speed.

The power grid is formed by using a large amount of metal lines. Electromigration (EM) has long been a problem in power grids used in the semiconductor industry. As electrons pass through a conductor (e.g. a metal wire/trace), they tend to drag the metallic ions of the conductor along with them through electrostatic attraction. This results in a slight concentration gradient in the direction of electron flow which in turn sets up an opposing diffusion gradient, so-called back pressure, that tends to move ions towards regions of lower density. If current flows long enough at a sufficiently high current density, the 'electron wind' effect dominates and vacancies form which eventually lead to voids and, finally, open circuits, thus decreasing the reliability of chips.

Therefore, new structures for power grids are desired to address the above issues.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
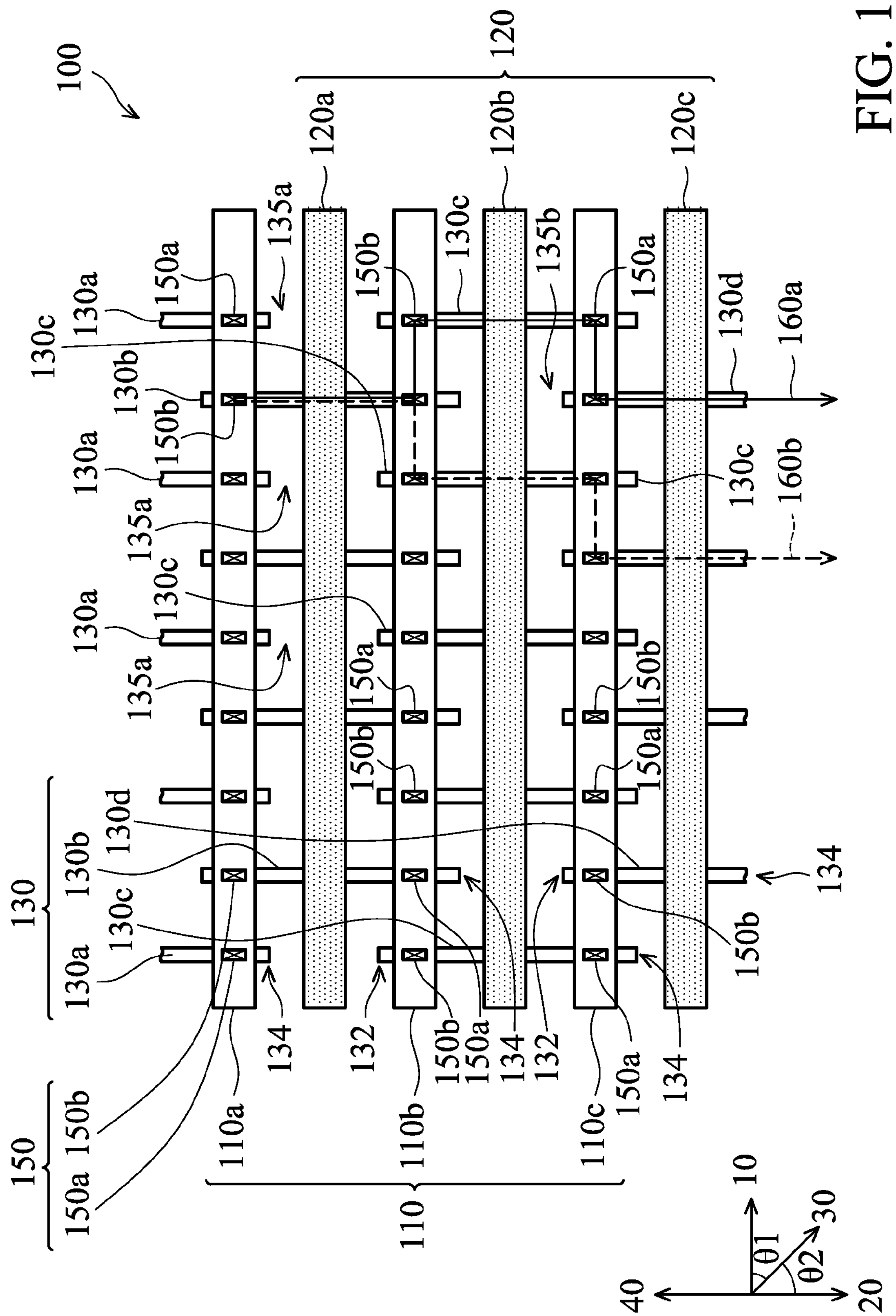
FIG. 1 shows a power grid of an integrated circuit (IC), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a power grid 100 of an integrated circuit (IC), in accordance with some embodiments of the disclosure. The power grid 100 is a power delivery structure.

In order to simplify the description, only a single power delivery structure is provided in the power grid 100, so as to deliver a supply voltage (VDD) or a grounding voltage (VSS) from a voltage source to a plurality of standard cells (or memory cells, logic cells, etc.) below the power grid 100 throughout the IC.

A plurality of power traces 130 are disposed in a metal layer $M_n$, and a plurality of power traces 110 and 120 are disposed in a metal layer $M_{n+1}$. In some embodiments, the power traces 110 and 130 are used to deliver a first power, such as a supply voltage (e.g. VDD), and the power traces 120 are used to deliver a second power, such as a grounding power (e.g. VSS).

In FIG. 1, the metal layer $M_{n+1}$ is disposed on the metal layer $M_n$. For example, the metal layer $M_{n+1}$ is an upper metal layer, and the metal layer $M_n$ is a lower metal layer. In some embodiments, the metal layer $M_n$ is disposed on the metal layer $M_{n+1}$, e.g. the metal layer $M_n$ is an upper metal layer, and the metal layer $M_{n+1}$ is a lower metal layer.

The power traces 110 capable of delivering the first power and the power traces 120 capable of delivering the second power are arranged parallel to a direction 10, and the power traces 130 capable of delivering the first power are arranged parallel to a direction 20. In FIG. 1, the direction 10 is perpendicular to the direction 20.

The power traces 110 capable of delivering the first power and the power traces 120 capable of delivering the second power are alternately arranged in the power grid 100. Specifically, the power trace corresponding to the first power is disposed between two adjacent power traces corresponding to the second power, and the power trace corresponding to the second power is disposed between two adjacent power traces corresponding to the first power. For example, the power trace 120*a* is disposed between the power traces 110*a* and 110*b*, and the power trace 120*b* is disposed between the power traces 110*b* and 110*c*. Furthermore, the power trace 110*b* is disposed between the power traces 120*a* and 120*b*, and the power trace 110*c* is disposed between the power traces 120*b* and 120*c*.

Each power trace 130 is a metal line having a first end 132 and a second end 134, and the power trace 130 extends from its first end 132 to its second end 134 along the direction 20. Furthermore, the power traces 130 are separated from each other by a plurality of gaps in the metal layer $M_n$ along the direction 20. For example, the power traces 130*a* and 130*c* are disposed in the same straight line parallel to the direction 20, and the power traces 130*a* and 130*c* are separated from the gaps 135*a*. Similarly, the power traces 130*b* and 130*d* are disposed in the same straight line parallel to the direction 20, and the power traces 130*b* and 130*d* are separated from the gaps 135*b*.

Each gap 135*a*/135*b* is present between the second end 134 of each power trace 130 and the first end 132 of the adjacent power trace 130, and the power trace 130 and the adjacent power trace 130 are disposed in the same straight line along the direction 20. In some embodiments, the gaps 135*a* and 135*b* are filled with a dielectric material in the metal layer $M_n$ of the IC in a semiconductor process. In some embodiments, the gaps 135*a* and 135*b* are capable of providing routing spaces for the standard cells (or memory cells, logic cells, etc.) below the power grid 100, thereby increasing routing resources for the IC.

In FIG. 1, each gap 135*a* between the power traces 130*a* and 130*c* is surrounded by the two adjacent power traces 130*b*, and each gap 135*b* between the power traces 130*b* and 130*d* is surrounded by the two adjacent power traces 130*c*.

A plurality of vias 150 are coupled between the power traces 110 and 130, and the vias 150 are arranged between the metal layers $M_{n+1}$ and $M_n$. The vias 150 are divided into a plurality of vias 150*a* and 150*b*, and the vias 150*a* and 150*b* are alternately arranged in the power traces 110. In each power trace 110, each via 150*a* is arranged between the two adjacent vias 150*b*, and each via 150*b* is arranged between the two adjacent vias 150*a*. In some embodiments, the distance between the two adjacent vias 150*a* is equal to the distance between the two adjacent vias 150*b*. In some embodiments, the distances between the via 150*a* and the adjacent vias 150*b* are the same. In some embodiments, the distances between the via 150*a* and the adjacent vias 150*b* are different.

In some embodiments, the vias 150*a* and the vias 150*b* arranged in the same straight line parallel to the direction 10 are coupled to the same power trace 110.

For each power trace 110, the vias 150*a* are used to couple the second ends 134 of the power traces 130, and the vias 150*b* are used to couple the first ends 132 of the power traces 130. For example, the power trace 110*a* is coupled to the second end 134 of each power trace 130*a* through the via 150*a*, and the power trace 110*a* is coupled to the first end 132 of each power trace 130*b* through the via 150*b*. The power trace 110*b* is coupled to the first end 132 of each power trace 130*c* through the via 150*b*, and the power trace 110*b* is coupled to the second end 134 of each power trace 130*b* through the via 150*a*.

In the power grid 100, the power traces 130 are arranged in parallel, and the power traces 130 are distributed along a direction 30. As described above, each power trace 130 extends from the first end 132 to the second end 134 thereof along the direction 20. An included angle θ 1 between the direction 10 and the direction 30 is less than a right angle (e.g. 90 degrees). Similarly, an included angle θ 2 between the direction 20 and the direction 30 is also less than a right angle.

For each power trace 110, the power traces 130 coupled to the same power trace 110 can be divided into a first group and a second group. In the first group, each power trace 130 is coupled to the power trace 110 through the via 150*a*. In the second group, each power trace 130 is coupled to the power trace 110 through the via 150*b*.

Taking the power trace 110*b* as an example, the power traces 130*b* coupled to the power trace 110*b* through the via 150*a* are classified as the first group, and the power traces 130*c* coupled to the power trace 110*b* through the via 150*b* are classified as the second group. In the first group, each power trace 130*b* is arranged to extend from the power trace 110*b* to couple to the power trace 110*a* along a direction 40, and the direction 40 is perpendicular to the direction 10. In the second group, each power trace 130*c* is arranged to extend from the power trace 110*b* to couple to the power trace 110*c* along the direction 20, and the direction 20 is opposite from the direction 40.

In some embodiments, the lengths of the power traces 130 are the same. For example, the power traces 130*a*, 130*b*, 130*c* and 130*d* are the same length. In some embodiments, the lengths of the power traces 130 may be different. It should be noted that the length of each power trace 130 is shorter than a distance across the three adjacent power traces 110. For example, the length of the power trace 130*b* is shorter than a distance across the power traces 110*a*, 110*b* and 110*c*. Due to the shorter metal line having a better electromigration (EM) performance, the power traces 130 in the power grid 100 have a better EM performance than a mesh-type power grid formed by a metal array. Furthermore, the length of each power trace 130 is enough to couple the two adjacent power traces 110, i.e. the length of each power trace 130 is longer than a distance across the two adjacent power traces 110. For example, the length of the power trace 130*b* is longer than a distance across the power traces 110*a* and 110*b*. In other words, the first end 132 and the second end 134 of each power trace 130 are coupled to the two adjacent power traces 110, respectively. For example, the first end 132 and the second end 134 of the power trace 130*b* are respectively coupled to the two adjacent power traces 110*a* and 110*b*.

In some embodiments, the lengths and widths of the power traces 130 are determined according to design rules (e.g. EM rule) of semiconductor processes corresponding to the IC. For example, assuming that a maximum length Lmax of a metal trace with a high EM performance is defined in an EM rule without considering a width of the metal trace, the length of each power trace 130 is equal to or shorter than the maximum length Lmax in the power grid 100.

In some embodiments, each power trace 130 has a minimum metal width. When the width of the power trace 130 is narrowed, the space occupied by the narrowed power trace 130 is decreased, thereby increasing routing space for the standard cells below the power grid 100. Furthermore, the narrowed power trace 130 only needs a small keep-out region to avoid a short-circuit in the process.

In FIG. 1, the power traces 110 and 130 form a plurality of zigzag metal lines in the power grid 100. The zigzag metal lines can provide additional current paths to decrease the number of IR hotspots. Therefore, for each via 150 of the power grid 100, in addition to a vertical current path vertically from the top via to the bottom via through the via 150, a plurality of horizontal current paths are provided by the zigzag metal lines of the power grid 100 along the directions of extension of the power traces 110 and 130 coupled to the via 150, thereby decreasing the number of IR hotspots. For example, for the via 150*b* disposed between the power trace 110*a* and the power trace 130*b*, a first horizontal current path 160*a* is formed from the via 150*b* between the power trace 110*a* and the power trace 130*b* to the adjacent power trace 130*d*, and the power traces 130*b* and 130*d* are arranged in the same straight line parallel to the direction 20. Simultaneously, a second horizontal current path 160*b* is formed from the via 150*b* between the power trace 110*a* and the power trace 130*b* to another power trace 130*d*, and the power traces 130*b* and 130*d* are arranged in different straight lines parallel to the direction 20. In FIG. 1, the horizontal current paths 160*a* and 160*b* are used as an example, and are not intended to limit the disclosure.

In the power grid 100, the zigzag metal lines formed in the metal layers $M_n$ and $M_{n+1}$ are used as an example, and are not intended to limit the disclosure. In some embodiments, the zigzag metal lines are formed by more metal layers. Furthermore, the power grid 100 can periodically be implemented in the IC.

Figure 2:
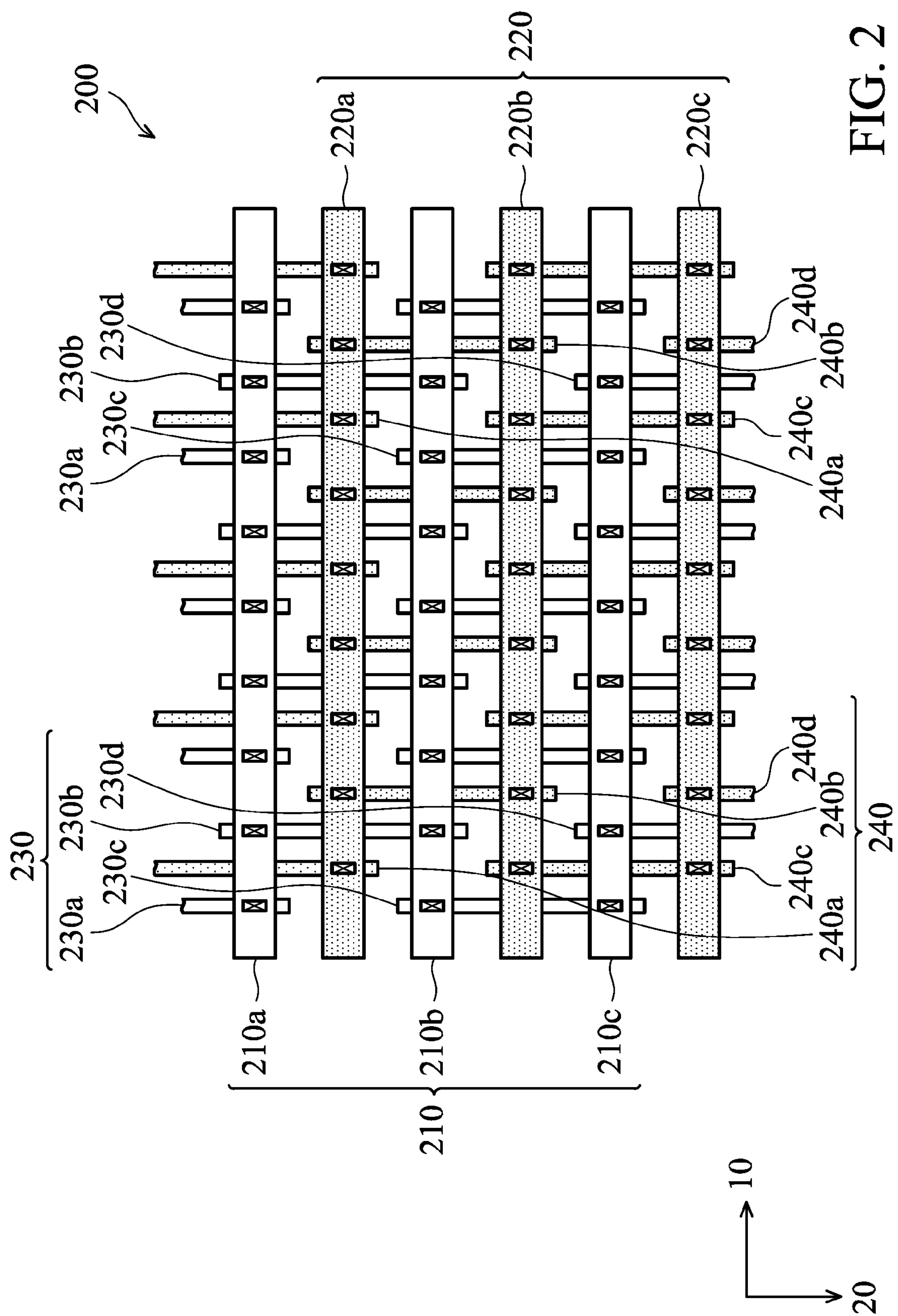
FIG. 2 shows a power grid of an IC, in accordance with some embodiments of the disclosure.

FIG. 2 shows a power grid 200 of an IC, in accordance with some embodiments of the disclosure. The power grid 200 is a power delivery structure for delivering a supply voltage (VDD) and a grounding power to a plurality of standard cells (or memory cells, logic cells, etc.) below the power grid 200 throughout the IC.

A plurality of power traces 230 and 240 are disposed in a metal layer $M_n$, and a plurality of power traces 210 and 220 are disposed in a metal layer $M_{n+1}$. In some embodiments, the power traces 210 and 230 are used to deliver a supply voltage (e.g. VDD). Furthermore, the power traces 220 and 240 are used to deliver a grounding power (e.g. VSS).

In FIG. 2, the metal layer $M_{n+1}$ is disposed on the metal layer $M_n$. For example, the metal layer $M_{n+1}$ is an upper metal layer, and the metal layer $M_n$ is a lower metal layer. In some embodiments, the metal layer $M_n$ is disposed on the metal layer $M_{n+1}$, e.g. the metal layer $M_n$ is an upper metal layer, and the metal layer $M_{n+1}$ is a lower metal layer.

The VDD power traces 210 and the VSS power traces 220 are parallel to a direction 10, and the VDD power traces 230 and the VSS power traces 240 are parallel to a direction 20. In FIG. 2, the direction 10 is perpendicular to the direction 20.

The VDD power traces 210 and the VSS power traces 220 are alternately arranged in the power grid 200. Specifically, the VDD power trace 210 is disposed between two adjacent VSS power traces 220, and the VSS power trace 220 is disposed between two adjacent VDD power traces 210. For example, the VSS power trace 220*a* is disposed between the VDD power traces 210*a* and 210*b*, and the VSS power trace 220*b* is disposed between the VDD power traces 210*b* and 210*c*. Furthermore, the VDD power trace 210*b* is disposed between the VSS power traces 220*a* and 220*b*, and the VDD power trace 210*c* is disposed between the VSS power traces 220*b* and 220*c*.

The VDD power traces 230 and the VSS power traces 240 are alternately arranged in the power grid 200. Specifically, the VDD power trace 230 is disposed between two adjacent VSS power traces 240, and the VSS power trace 240 is disposed between two adjacent VDD power traces 230. For example, the VSS power trace 240*a* is disposed between the VDD power traces 230*a* and 230*b*, and the VSS power trace 240*c* is disposed between the VDD power traces 230*c* and 230*d*. Furthermore, the VDD power trace 230*b* is disposed between the VSS power traces 240*a* and 240*b*, and the VDD power trace 230*d* is disposed between the VSS power traces 240*c* and 240*d*.

As described above, the VDD power traces 230 are separated from each other by a plurality of gaps in the metal layer $M_n$ along the direction 20. Similarly, the VSS power traces 240 are separated from each other by a plurality of gaps in the metal layer $M_n$ along the direction 20. In some embodiments, the gaps between the VSS power traces 240 and the VDD power traces 230 are filled with a dielectric material in the metal layer $M_n$ of the IC in a semiconductor process. In some embodiments, the gaps between the VSS power traces 240 and the VDD power traces 230 are capable of providing routing spaces for the standard cells (or memory cells, logic cells, etc.) below the power grid 200, thereby increasing routing resources for the IC.

In some embodiments, each gap between the two adjacent VDD power traces 230 disposed in the same straight line along the direction 20 is surrounded by the two VSS power traces 240 disposed in the two adjacent lines parallel to the direction 20. Moreover, each gap between the two adjacent VSS power traces 240 disposed in the same straight line along the direction 20 is surrounded by the two VDD power traces 230 disposed in the two adjacent lines parallel to the direction 20.

In the power grid 200, the VDD power traces 210 and 230 form a plurality of VDD zigzag metal lines for delivering the power VDD, and the VSS power traces 220 and 240 form a plurality of VSS zigzag metal lines for delivering the power VSS. The detailed connections and configurations of VDD and VSS zigzag metal lines are similar to the zigzag metal lines formed by the power traces 110 and 130 of FIG. 1, and will not be described further herein.

Figure 3:
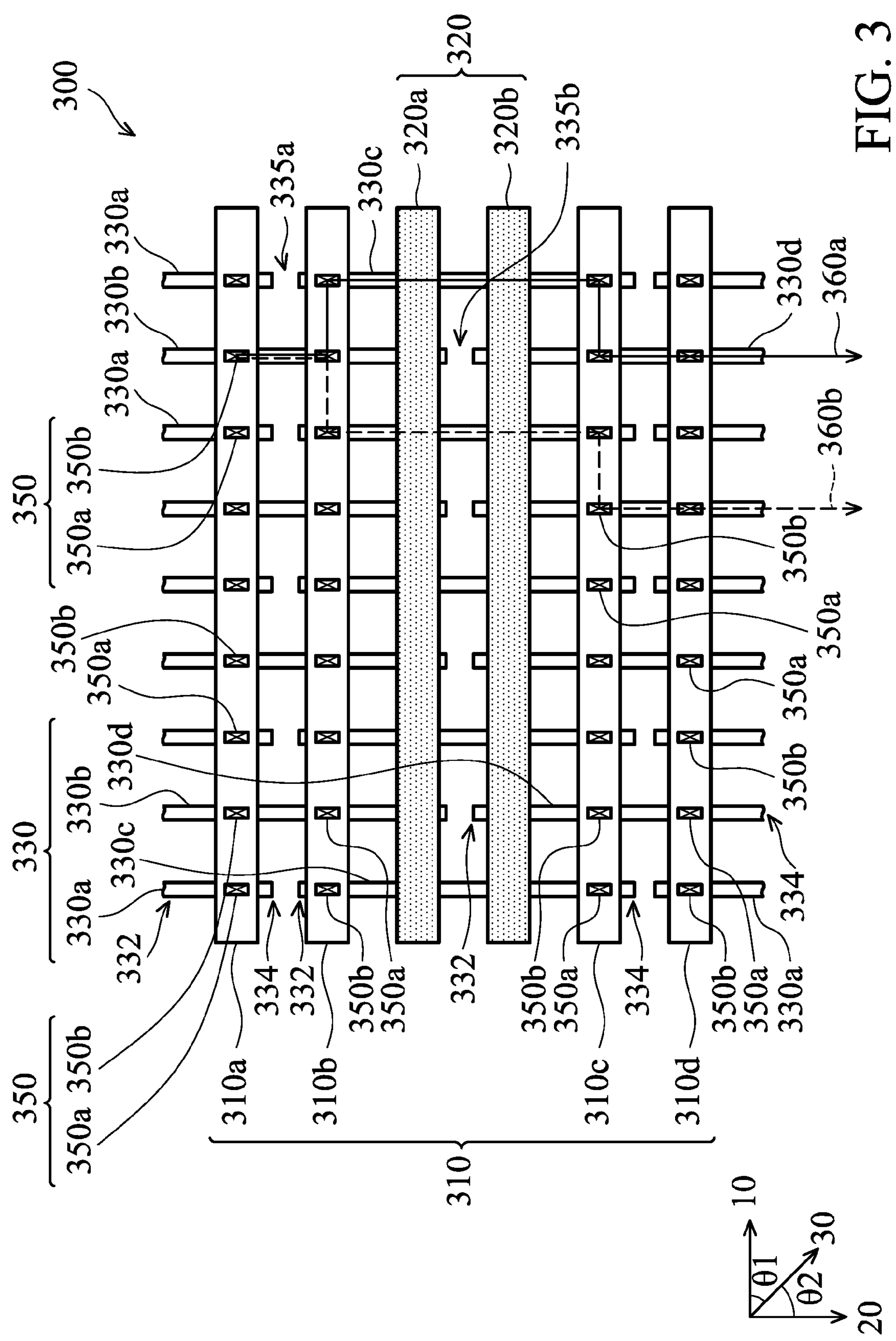
FIG. 3 shows a power grid of an IC, in accordance with some embodiments of the disclosure.

FIG. 3 shows a power grid 300 of an IC, in accordance with some embodiments of the disclosure. The power grid 300 is a power delivery structure.

In order to simplify the description, only a single power delivery structure is provided in the power grid 300, so as to deliver a supply voltage (VDD) or a grounding voltage (VSS) from a voltage source to a plurality of standard cells (or memory cells, logic cells, etc.) below the power grid 300 throughout the IC.

A plurality of power traces 330 are disposed in a metal layer $M_n$, and A plurality of power traces 310 and 320 are disposed in a metal layer $M_{n+1}$. The power traces 310 and 330 are used to deliver a first power, e.g. VDD, and the power traces 320 are used to deliver a second power, e.g. VSS.

In FIG. 3, the metal layer $M_{n+1}$ is disposed on the metal layer $M_n$. For example, the metal layer $M_{n+1}$ is an upper metal layer, and the metal layer $M_n$ is a lower metal layer. In some embodiments, the metal layer $M_n$ is disposed on the metal layer $M_{n+1}$, e.g. the metal layer $M_n$ is an upper metal layer, and the metal layer $M_{n+1}$ is a lower metal layer.

The power traces 310 capable of delivering the first power and the power traces 320 capable of delivering the second power are parallel to a direction 10, and the power traces 330 are arranged parallel to a direction 20. In FIG. 3, the direction 10 is perpendicular to the direction 20.

The power traces 310 capable of delivering the first power and the power traces 320 capable of delivering the second power are alternately arranged in the power grid 300 in pairs, such as a power-power-ground-ground (PPGG) structure. Specifically, a pair of VDD power traces 310 is disposed between two pairs of adjacent VSS power traces 320, and a pair of VSS power traces 320 is disposed between two pairs of adjacent VDD power traces 310. For example, the power traces 320*a* and 320*b* (e.g. a pair of power traces 320) are disposed between the power traces 310*a* and 310*b* (a pair of power traces 310) and the power traces 310*c* and 310*d* (another pair of power traces 310). Furthermore, the power trace 310*b* is disposed between the power traces 310*a* and 320*a*, and the power trace 320*a* is disposed between the power traces 310*b* and 320*b*. Moreover, the power trace 320*b* is disposed between the power traces 320*a* and 310*c*, and the power trace 310*c* is disposed between the power traces 320*b* and 310*d*.

Each power trace 330 is a metal line having a first end 332 and a second end 334, and the power trace 330 extends from its first end 332 to its second end 334 along the direction 20. Furthermore, the power traces 330 are separated from each other by a plurality of gaps in the metal layer $M_n$ along the direction 20. For example, the power traces 330*a* and 330*c* are disposed in the same straight line parallel to the direction 20, and the power traces 330*a* and 330*c* are separated from the gaps 335*a*. Similarly, the power traces 330*b* and 330*d* are disposed in the same straight line parallel to the direction 20, and the power traces 330*b* and 330*d* are separated from the gaps 335*b*.

As described above, the gaps 335*a* and 335*b* may be filled with a dielectric material in the metal layer $M_n$ of the IC in some embodiments. In some embodiments, the gaps 335*a* and 335*b* are capable of providing routing spaces for the standard cells (or memory cells, logic cells, etc.) below the power grid 300, thereby increasing routing resources for the IC.

In some embodiments, each gap 335*a* between the power traces 330*a* and 330*c* is surrounded by the two adjacent power traces 330*b*, and each gap 335*b* between the power traces 330*b* and 330*d* is surrounded by the two adjacent power traces 330*c*.

A plurality of vias 350 are coupled between the power traces 310 and 330, and the vias 350 are arranged between the metal layers $M_{n+1}$ and $M_n$. The vias 350 are divided into a plurality of vias 350*a* and 350*b*, and the vias 350*a* and 350*b* are alternately arranged in the power traces 310. In each power trace 310 of the power grid 300, the via 350*a* is arranged between the two adjacent vias 350*b*, and the via 350*b* is arranged between the two adjacent vias 350*a*. In some embodiments, the distance between the two adjacent vias 350*a* is equal to the distance between the two adjacent vias 350*b*. In some embodiments, the distances between each via 350*a* and the adjacent vias 350*b* are the same.

In some embodiments, the vias 350*a* and the vias 350*b* arranged in the same straight line parallel to the direction 10 are coupled to the same power trace 310.

For each power trace 310, the vias 350*a* are used to couple the second ends 334 of the power traces 330, and the vias 350*b* are used to couple the first ends 332 of the power traces 330. For example, the power trace 310*a* is coupled to the second end 334 of each power trace 330*a* through the via 350*a*, and the power trace 310*a* is coupled to the first end 332 of each power trace 330*b* through the via 350*b*. Furthermore, the power trace 310*b* is coupled to the second end 334 of each power trace 330*b* through the via 350*a*, and the power trace 310*b* is coupled to the first end 332 of each power trace 330*c* through the via 350*b*. Similarly, the power trace 310*c* is coupled to the second end 334 of each power trace 330*c* through the via 350*a*, and the power trace 310*c* is coupled to the first end 332 of each power trace 330*d* through the via 350*b*. Moreover, the power trace 310*d* is coupled to the second end 334 of each power trace 330*d* through the via 350*a*, and the power trace 310*d* is coupled to the first end 332 of each power trace 330*a* through the via 350*b*.

In the power grid 300, the power traces 330 are arranged in parallel, and the power traces 330 are distributed along a direction 30. As described above, an included angle θ 1 between the direction 10 and the direction 30 is less than a right angle (e.g. 90 degrees). Similarly, an included angle θ 2 between the direction 20 and the direction 30 is also less than a right angle.

For each power trace 310, the power traces 330 coupled to the same power trace 310 can be divided into a first group and a second group. In the first group, each power trace 330 is coupled to the power trace 310 through the via 350*a*. In the second group, each power trace 330 is coupled to the power trace 310 through the via 350*b*.

As described above, in the first group, each power trace 330 is arranged to extend from the power trace 310 to couple to the adjacent power trace 310 along a direction 40 that is perpendicular to the direction 10. In the second group, each power trace 330 is arranged to extend from the power trace 310 to couple to the other adjacent power trace 310 along the direction 20, and the direction 20 is opposite from the direction 40.

In some embodiments, the lengths of the power traces 330 are the same, for example, the power traces 330*a*, 330*b*, 330*c* and 330*d* are the same length. In some embodiments, the lengths of the power traces 330 may be different, for example, the lengths of the power traces 330*a* and 330*c* are longer than that of the power traces 330*b* and 330*d*. It should be noted that the length of each power trace 330 is shorter than a distance across the three adjacent power traces 310. Due to the shorter metal line having a better EM performance, the power traces 330 of the power grid 300 have a better EM performance than a mesh-type power grid. Furthermore, the length of each power trace 330 is enough to couple the two adjacent power traces 310. In other words, the first end 332 and the second end 334 of each power trace 330 are coupled to the two adjacent power traces 310, respectively. For example, the first end 332 and the second end 334 of the power trace 330*b* are respectively coupled to the two adjacent power traces 310*a* and 310*b*. Furthermore, the first end 132 and the second end 134 of the power trace 330*c* are respectively coupled to the two adjacent power traces 310*b* and 310*c*.

In some embodiments, the lengths and widths of the power traces 330 are determined according to design rules (e.g. EM rule) of semiconductor processes corresponding to the IC. For example, assuming that a maximum length Lmax of a metal trace with a high EM performance is defined in an EM rule without considering the width of the metal trace, the length of each power trace 330 is equal to or shorter than the maximum length Lmax in the power grid 300.

When the width of the power trace 330 is narrowed, the space occupied by the narrowed power trace 330 is decreased, thereby increasing routing space for the standard cells below the power grid 300. Furthermore, the narrowed power trace 330 only needs a small keep-out region to avoid a short-circuit in the process.

In FIG. 3, the power traces 310 and 330 form a plurality of zigzag metal lines in the power grid 300. The zigzag metal lines can provide additional current paths to decrease the number of IR hotspots. Therefore, for each via 350 of the power grid 300, in addition to a vertical current path vertically from the top via to the bottom via through the via 350, a plurality of horizontal current paths are provided by the zigzag metal lines of the power grid 300 along the directions of extension of the power traces 310 and 330 coupled to the via 350, thereby decreasing the number of IR hotspots. For example, for the via 350*b* disposed between the power trace 310*a* and the power trace 330*b*, a first horizontal current path 360*a* is formed from the via 350*b* between the power trace 310*a* and the power trace 330*b* to the adjacent power trace 330*d*, and the power traces 330*b* and 330*d* are arranged in the same straight line parallel to the direction 20. Simultaneously, a second horizontal current path 360*b* is formed the via 350*b* between the power trace 310*a* and the power trace 330*b* to another power trace 330*d*, and the power traces 330*b* and 330*d* are arranged in different straight lines parallel to the direction 20. In FIG. 3, the horizontal current paths 360*a* and 360*b* are used as an example, and are not intended to limit the disclosure.

In the power grid 300, the zigzag metal lines formed in the metal layers $M_n$ and $M_{n+1}$ are used as an example, and are not intended to limit the disclosure. In some embodiments, the zigzag metal lines are formed by more metal layers. Furthermore, the power grid 300 can periodically be implemented in the IC.

Figure 4:
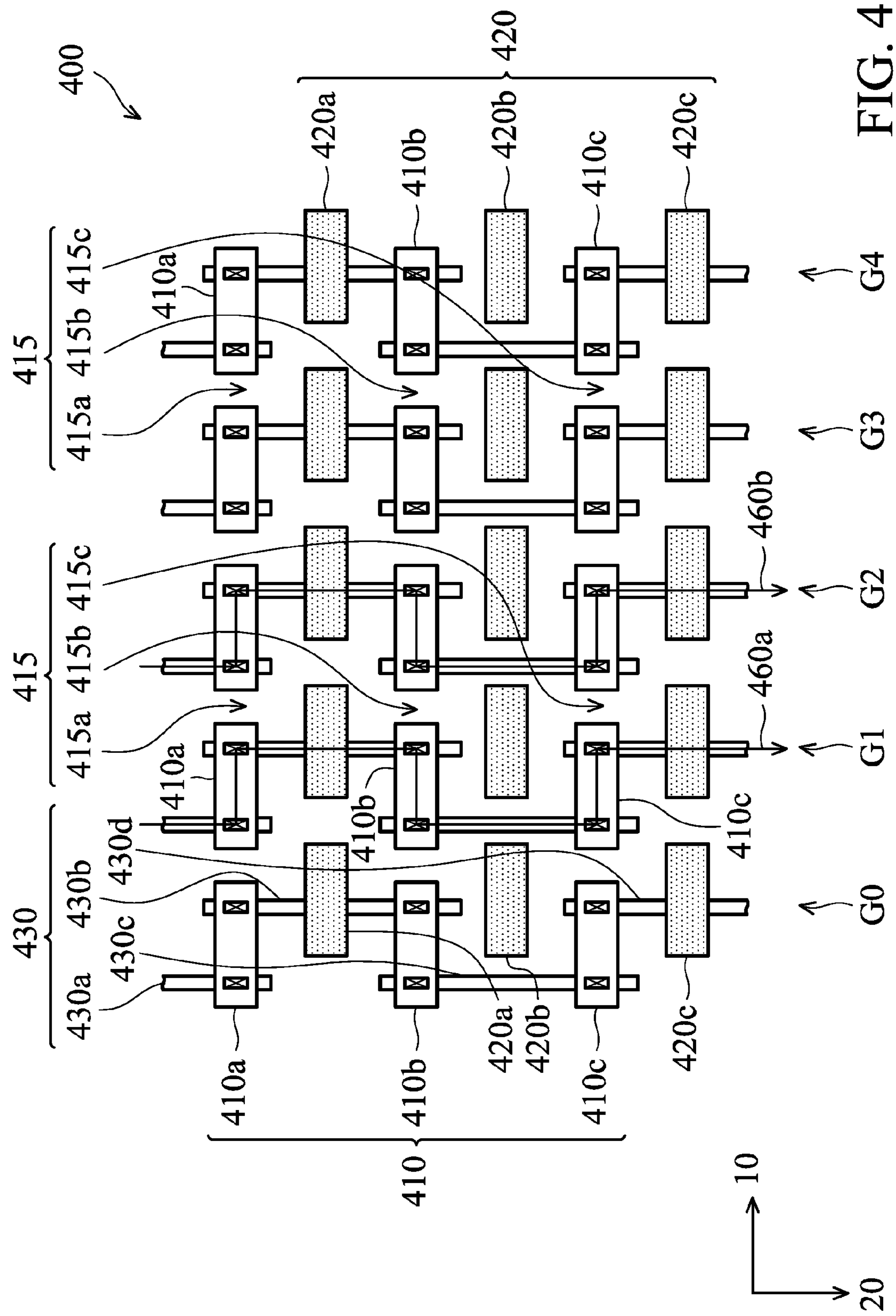
FIG. 4 shows a power grid of an IC, in accordance with some embodiments of the disclosure.

FIG. 4 shows a power grid 400 of an IC, in accordance with some embodiments of the disclosure. The power grid 400 is a power delivery structure.

Compared with the power grid 100 of FIG. 1, the power grid 400 is formed by a plurality of groups G0-G4. Each of the groups G0-G4 is capable of delivering a supply voltage (VDD) or a grounding voltage (VSS) from a voltage source to a plurality of standard cells (or memory cells, logic cells, etc.) below the corresponding group.

For each of the groups G0-G4, a plurality of power traces 430 are disposed in a metal layer $M_n$, and a plurality of power traces 410 and 420 are disposed in a metal layer $M_{n+1}$. The power traces 410 and 430 are used to deliver a first power, such as a supply voltage (e.g. VDD), and the power traces 420 are used to deliver a second power, such as a grounding voltage (e.g. VSS).

Each of the groups G0-G4 includes a zigzag metal line for delivering the first power. The detailed connections and configurations of zigzag metal line in each group are similar to the zigzag metal lines formed by the power traces 110 and 130 of FIG. 1, and will not be described further herein.

It should be noted that the power traces 410 of each group disposed in the straight line parallel to the direction 10 are separated from other groups by a plurality of gaps 415. For example, the power trace 410*a* of the group G1 is separated from the power trace 410*a* of the group G2 by the gap 415*a*, the power trace 410*b* of the group G1 is separated from the power trace 410*b* of the group G2 by the gap 415*b*, and the power trace 410*c* of the group G1 is separated from the power trace 410*c* of the group G2 by the gap 415*c*. Similarly, the power trace 410*a* of the group G3 is separated from the power trace 410*a* of the group G4 by the gap 415*a*, the power trace 410*b* of the group G3 is separated from the power trace 410*b* of the group G4 by the gap 415*b*, and the power trace 410*c* of the group G3 is separated from the power trace 410*c* of the group G4 by the gap 415*c*.

In some embodiments, the gaps 415 are filled with a dielectric material in a semiconductor process. In some embodiments, the gaps 415 are capable of providing routing spaces for the standard cells (or memory cells, logic cells, etc.) below the power grid 400, thereby increasing routing resources for the IC.

In some embodiments, the lengths of the power traces 410 are the same, for example, the power traces 410*a*, 410*b*, and 410*c* are the same length. It should be noted that the length of each power trace 410 is shorter than a distance across the two adjacent power traces 430*a*. Furthermore, the length of each power trace 410 is enough to couple the power trace 430*a* and the adjacent power trace 430*b*.

In some embodiments, the lengths of the power traces 430 are the same, for example, the power traces 430*a*, 430*b*, 430*c* and 430*d* are the same length. In some embodiments, the lengths of the power traces 430 may be different. It should be noted that the length of each power trace 430 is shorter than a distance across the three adjacent power traces 410. Due to the shorter metal line having a better EM performance, the power traces 430 of the power grid 400 have a better EM performance than a mesh-type power grid. Furthermore, the length of each power trace 430 is enough to couple the two adjacent power traces 410.

Compared with the power grid 100 of FIG. 1, in each of the groups G0-G4, each power trace 430 disposed in a first line parallel to the direction 20 is only coupled to one pair of power traces 430 via the corresponding vias and the two adjacent power traces 410. For example, the power trace 430*c* is coupled to only one power trace 430*b* via the power trace 410*b*, and the power trace 430*c* is coupled to only one power trace 430*d* via the power trace 410*c*. The power traces 430*b* and 430*d* are arranged in the same straight line parallel to the direction 20.

In each of the groups G0-G4, the zigzag metal line can provide an additional current path to decrease the number of IR hotspots. Therefore, for each via of the power grid 400, in addition to a vertical current path vertically from the top via to the bottom via through the via, a horizontal current path is provided by the zigzag metal line of the corresponding group along the directions of extension of the power traces 410 and 430 coupled to the via, thereby decreasing the number of IR hotspots. For example, for the via disposed between the power trace 410*a* and the power trace 430*b* in the group G1, a horizontal current path 460*a* is formed. For the via disposed between the power trace 410*a* and the power trace 430*b* of the group G2, a horizontal current path 460*b* is formed. In FIG. 4, the horizontal current paths 460*a* and 460*b* are used as an example, and are not intended to limit the disclosure.

By connecting the power traces 410 on the same straight line disposed in the same straight line parallel to the direction 10, a plurality of different power delivery structures are provided.

Figure 5:
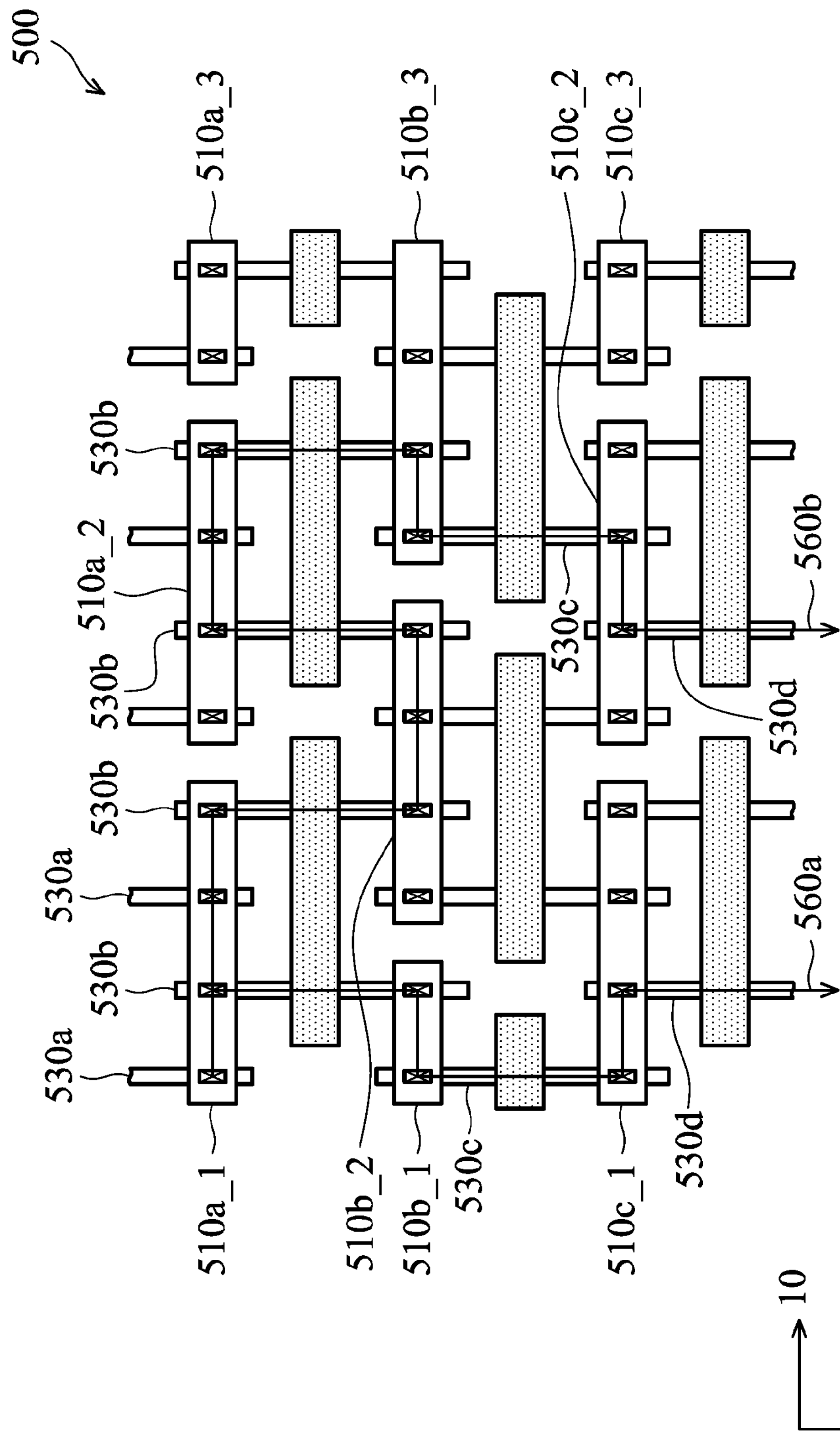
FIG. 5 shows a power grid of an IC, in accordance with some embodiments of the disclosure

FIG. 5 shows a power grid 500 of an IC, in accordance with some embodiments of the disclosure. The power grid 500 is a power delivery structure which is obtained by changing the connections of the power traces 410 of the power grid 400 in FIG. 4.

In FIG. 5, the power traces 510*a*_1, 510*a*_2 and 510*a*_3 are the power traces disposed in the same straight line parallel to the direction 10. The power traces 510*b*_1, 510*b*_2 and 510*b*_3 are the power traces disposed in the same straight line parallel to the direction 10. The power traces 510*c*_1, 510*c*_2 and 510*c*_3 are the power traces disposed in the same straight line parallel to the direction 10.

Referring to FIG. 4 and FIG. 5 together, the power trace 510*a*_1 is formed by connecting the power traces 410*a* of the groups G0 and G1, and the power trace 510*a*_2 is formed by connecting the power traces 410*a* of the groups G2 and G3. Furthermore, the power trace 510*b*_2 is formed by connecting the power traces 410*b* of the groups G1 and G2, and the power trace 510*b*_3 is formed by connecting the power traces 410*b* of the groups G3 and G4. Moreover, the power trace 510*c*_1 is formed by connecting the power traces 410*c* of the groups G0 and G1, and the power trace 510*c*_2 is formed by connecting the power traces 410*c* of the groups G2 and G3.

Similarly, a plurality of zigzag metal lines in the power grid 500 can provide additional current paths to decrease the number of IR hotspots. Therefore, for each via of the power grid 500, in addition to a vertical current path vertically from the top via to the bottom via through the corresponding via, a plurality of horizontal current paths are provided by the zigzag metal lines of the power grid 500 along the directions of extension of the power traces coupled to the via, thereby decreasing the number of IR hotspots. For example, for the via disposed between the power trace 510*a*_1 and the power trace 530*a*, a first horizontal current path 560*a* is formed from the via between the power trace 510*a*_1 and the power trace 530*a* through the adjacent power trace 530*b*, the power trace 510$b$_1, the power trace 530$c$, the power trace 510$c$_1 and the power trace 530$d$ in sequence. Simultaneously, a second horizontal current path 560$b$ is formed the via between the power trace 510$a$_1 and the power trace 530$a$ through another power trace 530$b$, the power trace 510$b$_2, the power trace 530$b$, the power trace 510$a$_2, the power trace 530$b$, the power trace 510$b$_3, the power trace 530$c$, the power trace 510$c$_2, and the power trace 530$d$ in sequence. In FIG. 5, the horizontal current paths 560$a$ and 560$b$ are used as an example, and are not intended to limit the disclosure.

Embodiments for zigzag power grid structures of IC are provided. In each zigzag power grid structure, narrow metal lines are used as the power traces to deliver one or more powers to the cells, devices or transistors below the zigzag power grid structure. Due to the power traces disposed in the same straight line being parallel to a specific direction, they are separated from each other by a plurality of gaps. The shorter and narrower power traces can provide more routing spaces for the cells, devices or transistors below the zigzag power grid structure, thereby increasing routing resources for the IC and improving EM performance. Furthermore, the zigzag power grid structures can provide a plurality of horizontal current paths to avoid local IR hotspots. In the zigzag power grid structures, since the resistance of the via is greater than that of the metal line, the via counts coupled to the power traces can be kept, so as to avoid IR degradation.

In some embodiments, a power grid of an integrated circuit (IC) is provided. The power grid includes a plurality of first power traces disposed in a first metal layer and parallel to a first direction, a plurality of second power traces disposed in a second metal layer and parallel to a second direction that is perpendicular to the first direction, and a plurality of third power traces disposed in the first metal layer parallel to the first direction. The first power traces arranged in the same straight line are separated from each other by a plurality of first gaps in the first metal layer, and the third power traces arranged in the same straight line are separated from each other by a plurality of second gaps in the first metal layer. Each of the first gaps is surrounded by the two adjacent third power traces, and each of the second gaps is surrounded by the two adjacent first power traces. The first power traces are coupled to the third power traces via the second power traces.

In some embodiments, another power grid of an IC is provided. The power grid includes a plurality of first power traces disposed in a first metal layer in parallel and distributed along a first direction, and a plurality of second power traces disposed in a second metal layer in parallel and arranged along a third direction that is perpendicular to the first direction. Each of the first power traces extends from a first end to a second end in a second direction. The first and second ends of each of the first power traces are coupled to the two adjacent second power traces. The first end of each of the first power traces is coupled to the second end of the adjacent first power trace through the same second power trace.

In some embodiments, another power grid of an IC is provided. The power grid includes a plurality of first power traces disposed in a first metal layer and separated from each other, and a plurality of second power traces disposed in a second metal layer in parallel and arranged in a first direction. The first power traces are divided into a first group and a second group. Each of the first power traces in the first group is coupled to the second power trace and extends from the coupled second power trace to couple to the adjacent second power trace along a second direction that is perpendicular to the first direction, and each of the first power traces in the second group is coupled to the second power trace and extends from the coupled second power trace to couple to the adjacent second power trace along a third direction that is opposite from the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power grid of an integrated circuit (IC), comprising:

a plurality of first power traces disposed in a first metal layer and parallel to a first direction;

a plurality of second power traces disposed in a second metal layer and parallel to a second direction that is perpendicular to the first direction; and a plurality of third power traces disposed in the first metal layer and parallel to the first direction;

wherein the first power traces arranged in the same straight line are separated from each other by a plurality of first gaps in the first metal layer, and the third power traces arranged in the same straight line are separated from each other by a plurality of second gaps in the first metal layer, wherein each of the first gaps is surrounded by the two adjacent third power traces, and each of the second gaps is surrounded by the two adjacent first power traces, wherein the first power traces are coupled to the third power traces via the second power traces.

2. The power grid as claimed in claim 1, further comprising:

a plurality of first vias disposed between the first and second metal layers and coupled to the second power traces; and a plurality of second vias disposed between the first and second metal layers and coupled to the second power traces, wherein each of the second vias is arranged between the two adjacent first vias, and each of the first vias is arranged between the two adjacent second vias, wherein each of the first power traces is coupled between the two adjacent second power traces via the corresponding first and second vias, respectively, and the first power trace is coupled to at least one pair of the third power traces via the first and second vias and the two adjacent second power traces.

3. The power grid as claimed in claim 2, wherein the at least one pair of the third power traces are arranged in the same straight line along the first direction.

4. The power grid as claimed in claim 2, wherein the first vias and the second vias arranged in the same straight line along the second direction are coupled to the same second power trace.

5. The power grid as claimed in claim 1, wherein the second power traces arranged in the same straight line are separated from each other by a plurality of third gaps in the second metal layer.

6. The power grid as claimed in claim 5, wherein a length of each of the second power traces is shorter than a first distance across the two adjacent first or third power traces along the second direction, and the length of each of the second power traces is longer than a second distance across the first power trace and the third power trace adjacent to the first power trace along the second direction.

7. The power grid as claimed in claim 1, wherein a length of each of the first power traces is equal to a length of each of the third power traces.

8. The power grid as claimed in claim 1, wherein a length of each of the first and third power traces is shorter than a first distance across the three adjacent second power traces, and the length of each of the first and third power traces is greater than a second distance across the two adjacent second power traces.

9. A power grid of an integrated circuit (IC), comprising:

a plurality of first power traces disposed in a first metal layer in parallel and distributed along a first direction, wherein each of the first power traces extends from a first end to a second end in a second direction; and a plurality of second power traces disposed in a second metal layer in parallel and arranged along a third direction that is perpendicular to the second direction, wherein the first and second ends of each of the first power traces are coupled to the two adjacent second power traces, wherein the first end of each of the first power traces is coupled to the second end of the adjacent first power trace through the same second power trace.

10. The power grid as claimed in claim 9, further comprising:

a plurality of first vias disposed between the first ends of the first power traces and the second power traces; and a plurality of second vias disposed between the second ends of the first power traces and the second power traces, wherein each of the second vias is arranged between the two adjacent first vias, and each of the first vias is arranged between the two adjacent second vias.

11. The power grid as claimed in claim 10, wherein the first vias and the second vias arranged in the same straight line along the third direction are coupled to the same second power trace.

12. The power grid as claimed in claim 10, wherein the second power traces arranged in the same straight line are separated from each other by a plurality of gaps in the second metal layer.

13. The power grid as claimed in claim 12, wherein a length of each of the second power traces is shorter than a first distance across the two adjacent first or second vias along the third direction, and the length of each of the second power traces is longer than a second distance across the first via and the adjacent second via along the third direction.

14. The power grid as claimed in claim 9, wherein a length of each of the first power traces is shorter than a first distance across the three adjacent second power traces, and the length of each of the first power traces is greater than a second distance across the two adjacent second power traces.

15. A power grid of an integrated circuit (IC), comprising:

a plurality of first power traces disposed in a first metal layer and separated from each other, wherein the first power traces are divided into a first group and a second group; and a plurality of second power traces disposed in a second metal layer in parallel and arranged in a first direction, wherein each of the first power traces in the first group is coupled to the second power trace and extends from the coupled second power trace to couple to the adjacent second power trace along a second direction that is perpendicular to the first direction, and each of the first power traces in the second group is coupled to the second power trace and extends from the coupled second power trace to couple to the adjacent second power trace along a third direction that is opposite from the second direction.

16. The power grid as claimed in claim 15, further comprising:

a plurality of first vias coupled between the second power traces and the first group of the first power traces; and a plurality of second vias coupled between the second power traces and the second group of the first power traces, wherein each of the second vias is arranged between the two adjacent first vias, and each of the first vias is arranged between the two adjacent second vias.

17. The power grid as claimed in claim 16, wherein the first vias and the second vias arranged in the same straight line along the first direction are coupled to the same second power trace.

18. The power grid as claimed in claim 16, wherein the second power traces arranged in the same straight line are separated from each other by a plurality of gaps in the second metal layer.

19. The power grid as claimed in claim 18, wherein a length of each of the second power traces is shorter than a first distance across the two adjacent first or second vias along the first direction, and the length of each of the second power traces is longer than a second distance across the first via and the adjacent second via along the first direction.

20. The power grid as claimed in claim 15, wherein a length of each of the first power traces is shorter than a first distance across the three adjacent second power traces, and the length of each of the first power traces is greater than a second distance across the two adjacent second power traces.

* * * * *